(12) United States Patent
Huang et al.

(10) Patent No.: US 10,930,233 B1
(45) Date of Patent: Feb. 23, 2021

(54) DISPLAY PANEL, DISPLAY DEVICE AND COMPENSATION METHOD FOR DISPLAY DEVICE

(71) Applicant: Shanghai Tianma Micro-Electronics Co., Ltd., Shanghai (CN)

(72) Inventors: Gaojun Huang, Shanghai (CN); Zhongjie Zhang, Shanghai (CN); Sha Lin, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/728,860

(22) Filed: Dec. 27, 2019

(30) Foreign Application Priority Data

Sep. 30, 2019 (CN) .......................... 201910945719.5

(51) Int. Cl.
*G09G 3/36* (2006.01)
*H01L 27/32* (2006.01)
*G02F 1/1333* (2006.01)
*G06F 3/044* (2006.01)
*G06F 3/042* (2006.01)
(Continued)

(52) U.S. Cl.
CPC ....... *G09G 3/3607* (2013.01); *G02F 1/13338* (2013.01); *G02F 1/133514* (2013.01); *G02F 1/133603* (2013.01); *G02F 1/134336* (2013.01); *G06F 3/0425* (2013.01); *G06F 3/0446* (2019.05); *G09G 3/3208* (2013.01); *G09G 3/36* (2013.01); *H01L 27/322* (2013.01); *H01L 27/323* (2013.01); *H01L 27/3232* (2013.01); *H01L 27/3244* (2013.01); *H01L 51/5253* (2013.01); *H04N 9/646* (2013.01); *G02F 2201/121* (2013.01); *G02F 2201/123* (2013.01); *G02F 2201/44* (2013.01); *G09G 2300/0439* (2013.01)

(58) Field of Classification Search
USPC ....................................................... 345/174
See application file for complete search history.

(56) References Cited

U.S. PATENT DOCUMENTS

| 10,580,848 B1* | 3/2020 | Ma ....................... H01L 27/3216 |
| 2005/0007517 A1* | 1/2005 | Anandan ........... G02F 1/133603 349/69 |

(Continued)

FOREIGN PATENT DOCUMENTS

CN        106842731 A    6/2017

*Primary Examiner* — Chineyere D Wills-Burns
(74) *Attorney, Agent, or Firm* — Miller, Matthias & Hull LLP

(57) ABSTRACT

Provided are a display panel, a display device and a compensation method for the display device. The display panel includes an organic light-emitting diode display panel and a liquid crystal display panel, where the organic light-emitting diode display panel in a first display region is configured as a backlight for the liquid crystal display panel. The organic light-emitting diode display panel includes a first array substrate and an organic light-emitting function film. The first array substrate includes a first pixel driving circuit, where the first pixel driving circuit includes a first A-type pixel driving circuit and a first B-type pixel driving circuit, and a density of the first A-type pixel driving circuit is less than a density of the first B-type pixel driving circuit.

18 Claims, 11 Drawing Sheets

(51) Int. Cl.
*G02F 1/13357* (2006.01)
*H04N 9/64* (2006.01)
*H01L 51/52* (2006.01)
*G02F 1/1335* (2006.01)
*G09G 3/3208* (2016.01)
*G02F 1/1343* (2006.01)

(56) References Cited

U.S. PATENT DOCUMENTS

| | | | | |
|---|---|---|---|---|
| 2006/0109397 | A1* | 5/2006 | Anandan | G02F 1/133603 349/69 |
| 2009/0315822 | A1* | 12/2009 | Biebel | B60K 35/00 345/102 |
| 2011/0050545 | A1* | 3/2011 | Namm | G09G 3/20 345/5 |
| 2012/0006978 | A1* | 1/2012 | Ludwig | G06F 3/0412 250/214.1 |
| 2014/0226110 | A1* | 8/2014 | Doyle | G02F 1/133603 349/69 |
| 2017/0139218 | A1* | 5/2017 | Lu | G09G 3/3607 |
| 2017/0162111 | A1* | 6/2017 | Kang | H01L 27/3276 |
| 2017/0221419 | A1* | 8/2017 | Xiang | G09G 3/3233 |
| 2017/0286044 | A1* | 10/2017 | Kim | G02F 1/133514 |
| 2018/0075814 | A1* | 3/2018 | Parikh | H01L 27/3232 |
| 2019/0189726 | A1* | 6/2019 | Wu | H01L 27/3267 |
| 2020/0058247 | A1* | 2/2020 | Zhang | G02F 1/136209 |

* cited by examiner

DISPLAY PANEL, DISPLAY DEVICE AND COMPENSATION METHOD FOR DISPLAY DEVICE

CROSS-REFERENCES TO RELATED APPLICATIONS

This application claims priority to Chinese patent application No. CN201910945719.5 filed at the CNIPA on Sep. 30, 2019, the disclosure of which is incorporated herein by reference in its entirety.

TECHNICAL FIELD

The present disclosure relates to the field of display techniques and, in particular, to a display panel, a display device and a compensation method for a display device.

BACKGROUND

With the development of science and technology, more and more electronic apparatuses with a display function are widely applied to people's daily life and work, bringing great convenience, and becoming essential tools for people today.

A display panel is an important member of one electronic apparatus for implementing the display function. In an existing display panel, in order to accommodate to requirements for integrating optical electronic elements in the electronic apparatus, a hollowed-out region needs to be configured in a setting region of the display panel for disposing the optical electronic elements.

Since the optical electronic elements are disposed, sub-pixels in the hollowed-out region and sub-pixels in a normal display region have different display effects, affecting a normal display of the display panel.

SUMMARY

In view of this, the embodiments of the present disclosure provide a display panel, a display device and a compensation method for a display device, providing a new structure for a display panel, and ensuring a good display effect of the display panel and a high working sensitivity of a sensor.

In a first aspect, an embodiment of the present disclosure provides a display panel including a first display region and a second display region, where the first display region is reused as a sensor reservation region.

The display panel further includes an organic light-emitting diode display panel and a liquid crystal display panel. The organic light-emitting diode display panel is disposed in the first display region and the second display region, the liquid crystal display panel is disposed in the first display region and on a light-emitting side of the organic light-emitting diode display panel, and the organic light-emitting diode display panel in the first display region is configured as a backlight for the liquid crystal display panel.

The organic light-emitting diode display panel includes a first array substrate and an organic light-emitting function film. The first array substrate includes a first pixel driving circuit, and the first pixel driving circuit includes a first A-type pixel driving circuit and a first B-type pixel driving circuit. The first A-type pixel driving circuit is used for driving the organic light-emitting function film in the first display region to emit light, the first B-type pixel driving circuit is used for driving the organic light-emitting function film in the second display region to emit light, and a density of the first A-type pixel driving circuit is less than a density of the first B-type pixel driving circuit.

The liquid crystal display panel includes a plurality of first sub-pixels, and the plurality of first sub-pixels have a first sub-pixel density. The organic light-emitting function film in the second display region includes a plurality of second sub-pixels, and the plurality of second sub-pixels have a second sub-pixel density. The first sub-pixel density is the same as the second sub-pixel density.

In a second aspect, an embodiment of the present disclosure further provides a display device including a display panel and a sensor. The display panel is a display panel described in the first aspect.

The sensor is disposed in a sensor reservation region.

In a third aspect, an embodiment of the present disclosure further provides a compensation method for a display device. The display device includes a liquid crystal display panel, an organic light-emitting diode display panel and a camera module. The liquid crystal display panel includes a color filter substrate, and the color filter substrate includes a first color resist layer. The compensation method is used for compensating the display device described in the second aspect at a camera shooting stage, and the method includes steps described below.

A basic image shot by the display device is acquired, where the basic image includes information about the first color resist layer.

A compensation algorithm is determined according to the information about the first color resist layer, where the compensation algorithm is used for eliminating the information about the first color resist layer.

A subsequently-shot image is compensated by using the compensation algorithm.

BRIEF DESCRIPTION OF DRAWINGS

Other features, objects and advantages of the present disclosure will become more apparent from a detailed description of non-restrictive embodiments with reference to the drawings.

DETAILED DESCRIPTION

In order to make the objects, technical solutions and advantages of the present disclosure clearer, the technical solutions of the present disclosure will be described below in detail in conjunction with the drawings in embodiments of the present disclosure and the specific embodiments. Apparently, the described embodiments are part, not all, of embodiments of the present disclosure, and based on the embodiments of the present disclosure, all other embodiments acquired by those skilled in the art on the premise that no creative work is done are within the scope of the present disclosure.

Figure 1:
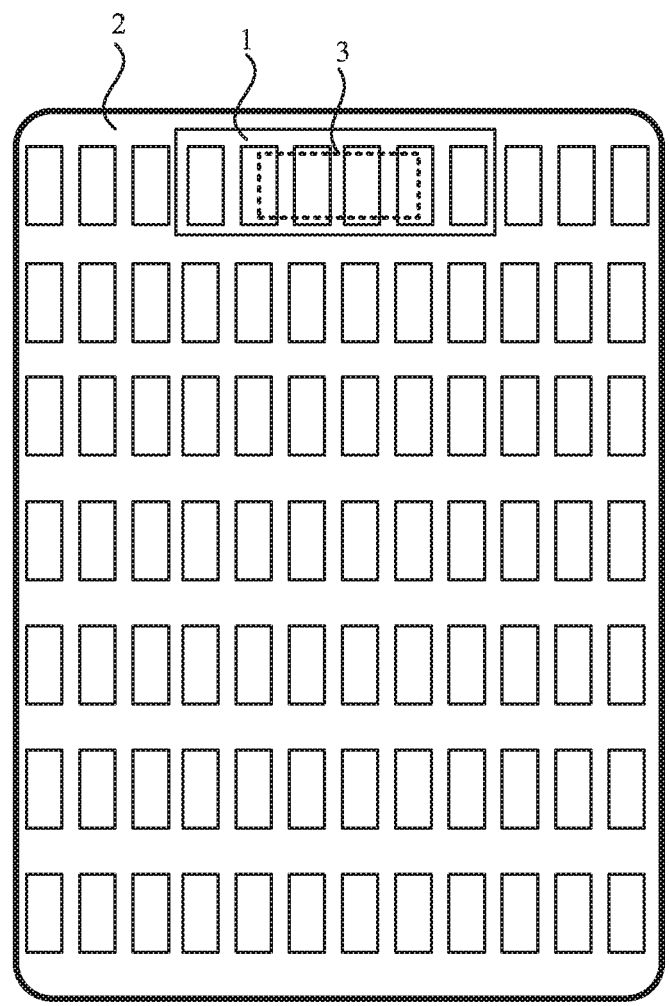
FIG. 1 is a structural diagram of a display panel in the related art.

FIG. 1 is a structural diagram of a display panel in the related art. As shown in FIG. 1, an existing full-screen display device includes a first display region 1 and a second display region 2, where the first display region 1 is configured with an optical electronic element 3, such as a camera or an optical sensor, and the first display region 1 may implement a display function and a light-transmissive function simultaneously. However, the camera or the optical sensor needs to receive a large amount of light in a working process, but the first display region 1 in the existing full-screen display device is further used for a display and display elements occupy a large space, causing poor light-transmissive performance of the first display region 1, and affecting normal use of the optical electronic element 3.

The inventor has found by research that an amount of light transmitted through the first display region 1 may be increased by reducing a pixel density of the first display region 1 to ensure the normal use of the optical electronic element 3. However, the reduction of the pixel density of the first display region 1 will cause a fuzzy display in the first display region 1, so that the first display region 1 and the second display region 2 have different display effects, affecting a display effect of the display panel.

Based on the above technical problems, the inventor has further developed technical solutions provided by the embodiments of the present disclosure. A display panel provided by the embodiments of the present disclosure includes a first display region and a second display region, where the first display region is reused as a sensor reservation area. The display panel further includes an organic light-emitting diode display panel and a liquid crystal display panel, where the organic light-emitting diode display panel is disposed in the first display region and the second display region, the liquid crystal display panel is disposed in the first display region and on a light-emitting side of the organic light-emitting diode display panel, and the organic light-emitting diode display panel in the first display region is configured as a backlight for the liquid crystal display panel. The organic light-emitting diode display panel includes a first array substrate and an organic light-emitting function film. The first array substrate includes a first pixel driving circuit, and the first pixel driving circuit includes a first A-type pixel driving circuit and a first B-type pixel driving circuit. The first A-type pixel driving circuit is used for driving the organic light-emitting function film in the first display region to emit light, the first B-type pixel driving circuit is used for driving the organic light-emitting function film in the second display region to emit light, and a density of the first A-type pixel driving circuit is less than a density of the first B-type pixel driving circuit. The liquid crystal display panel includes a plurality of first sub-pixels, and the plurality of first sub-pixels have a first sub-pixel density. The organic light-emitting function film in the second display region includes a plurality of second sub-pixels, and the plurality of second sub-pixels have a second sub-pixel density. The first sub-pixel density is the same as the second sub-pixel density. With the above-mentioned technical solution, the display panel includes the organic light-emitting diode display panel and the liquid crystal display panel, where the organic light-emitting diode display panel is disposed in the first display region and the second display region, the liquid crystal display panel is disposed in the first display region and on the light-emitting side of the organic light-emitting diode display panel, and the organic light-emitting diode display panel in the first display region is configured as the backlight for the liquid crystal display panel; the density of the first A-type pixel driving circuit used for driving the organic light-emitting function film in the first display region to emit light is less than the density of the first B-type pixel driving circuit used for driving the organic light-emitting function film in the second display region to emit light, ensuring a larger transparent region of the first display region, increasing a luminous flux received by a sensor disposed in the first display region, and improving a working sensitivity of the sensor; and a density of the first sub-pixels in the liquid crystal display panel is the same as a density of the second sub-pixels in the second display region, ensuring that the first display region and the second display region have a same display sub-pixel density in a display process of the display panel, and ensuring good uniformity of display effects of the first display region and the second display region.

The above is the core idea of the present disclosure, and technical solutions in the embodiments of the present disclosure will be described clearly and completely in conjunction with the drawings in the embodiments of the present disclosure. Based on the embodiments of the present disclosure, all other embodiments obtained by those skilled in the art without creative work are within the scope of the present disclosure.

Figure 2:
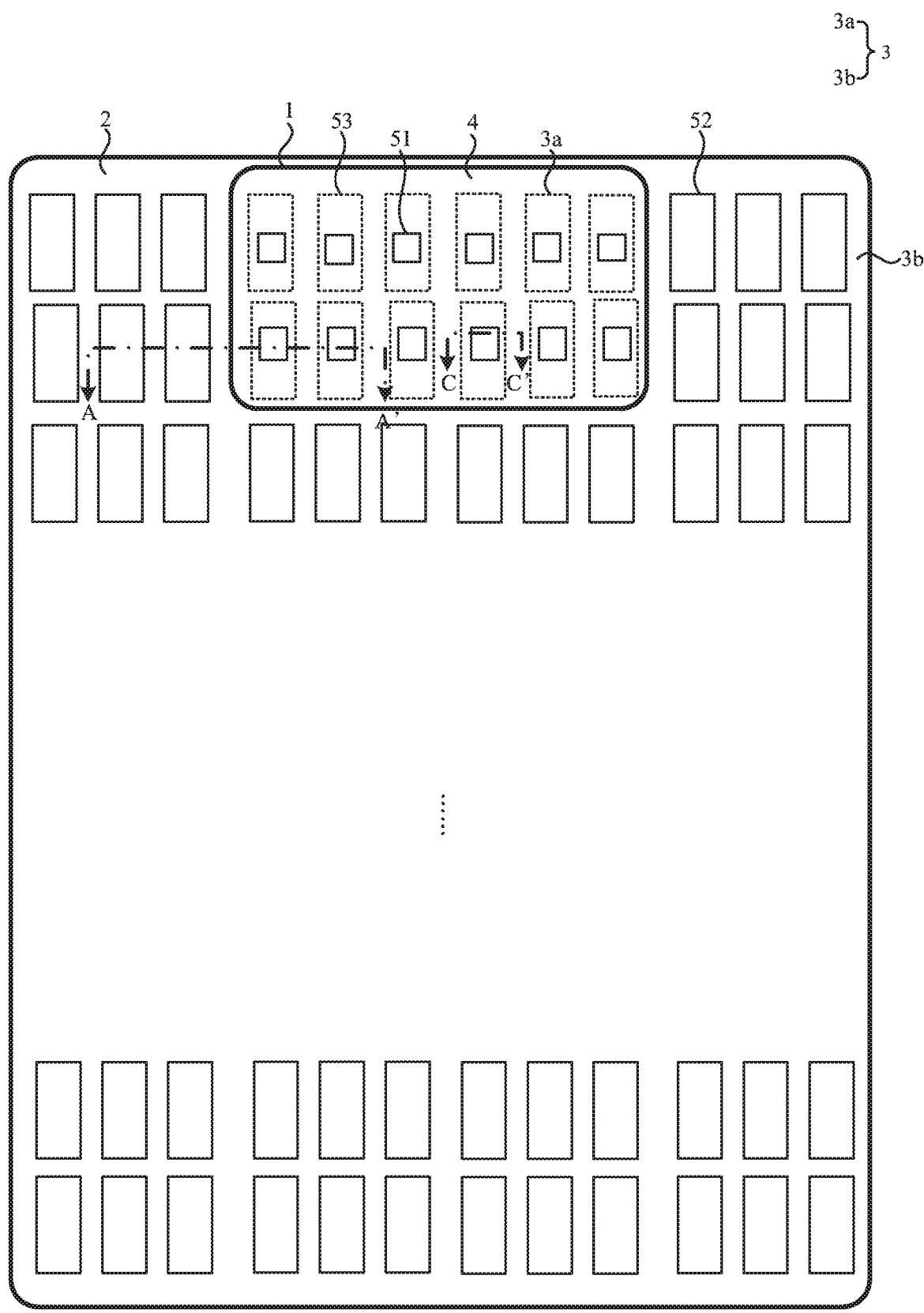
FIG. 2 is a structural diagram of a display panel according to an embodiment of the present disclosure.
Figure 3:
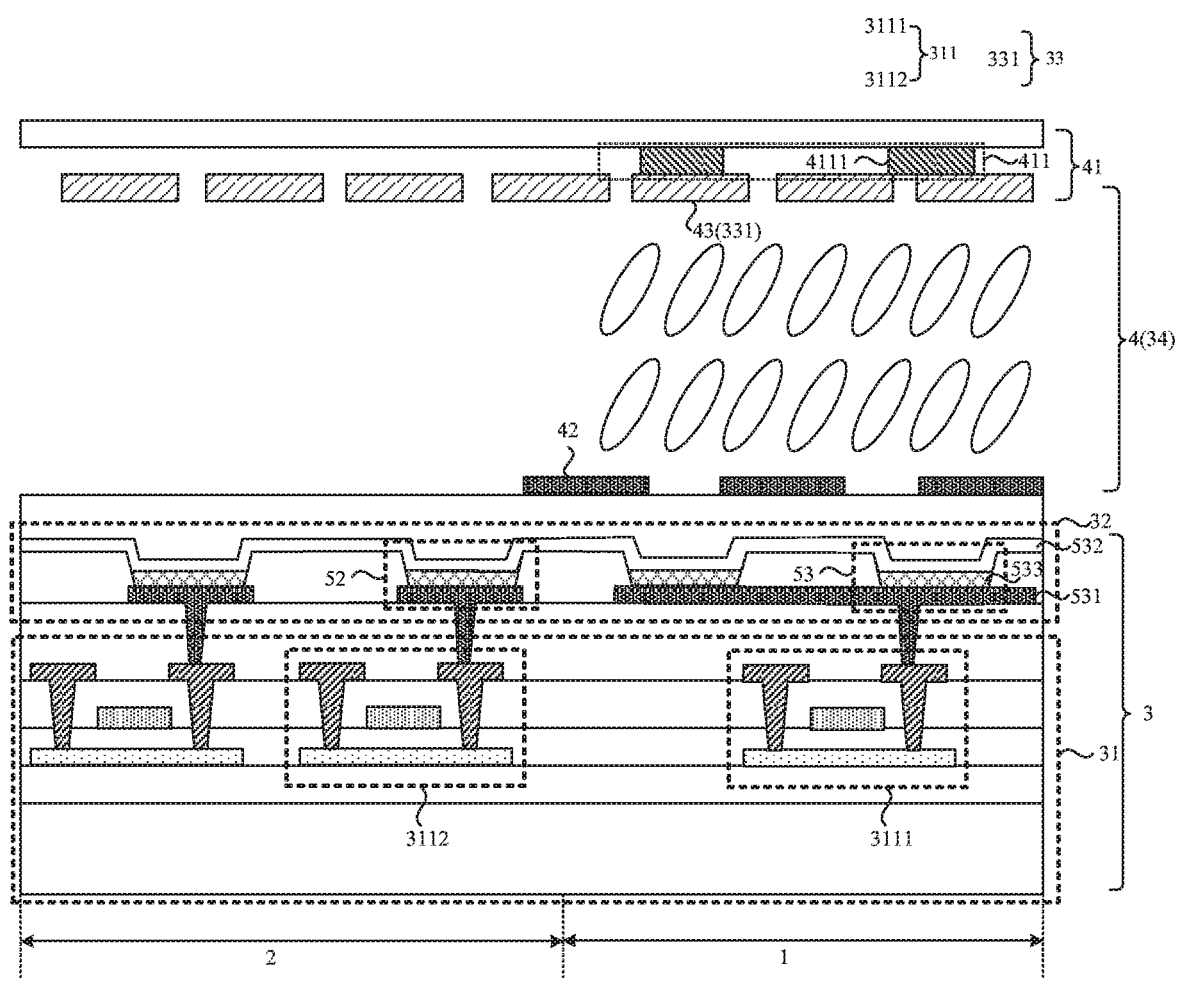
FIG. 3 is a sectional view of the display panel shown in FIG. 2 taken along a section line A-A'.

FIG. 2 is a structural diagram of a display panel according to an embodiment of the present disclosure. FIG. 3 is a sectional view of the display panel shown in FIG. 2 taken along a section line A-A'. As shown in FIG. 2 and FIG. 3, the display panel provided by the embodiments of the present disclosure includes a first display region 1 and a second display region 2, where the first display region is reused as a sensor reservation area; the display panel further includes an organic light-emitting diode display panel 3 and a liquid crystal display panel 4, where the organic light-emitting diode display panel 3 is disposed in the first display region 1 and the second display region 2, the liquid crystal display panel 4 is disposed in the first display region 1 and on a light-emitting side of the organic light-emitting diode display panel 3, and the organic light-emitting diode display panel 3 in the first display region 1 is configured as a backlight for the liquid crystal display panel 4; where the organic light-emitting diode display panel 3 includes a first array substrate 31 and an organic light-emitting function film 32, where the first array substrate 31 includes a first pixel driving circuit 311, the first pixel driving circuit 311 includes a first A-type pixel driving circuit 3111 and a first B-type pixel driving circuit 3112, the first A-type pixel driving circuit 3111 is used for driving the organic light-emitting function film 32 in the first display region 1 to emit light, the first B-type pixel driving circuit 3112 is used for driving the organic light-emitting function film 32 in the second display region 2 to emit light, and a density of the first A-type pixel driving circuit 3111 is less than a density of the first B-type pixel driving circuit 3112; the liquid crystal display panel 4 includes a plurality of first sub-pixels 51, and the plurality of first sub-pixels 51 have a first sub-pixel density; the organic light-emitting function film 32 in the second display region 2 includes a plurality of second sub-pixels 52, and the plurality of second sub-pixels 52 have a second sub-pixel density, where the first sub-pixel density is the same as the second sub-pixel density.

Exemplarily, the display panel provided by the embodiments of the present disclosure includes the organic light-emitting diode display panel 3 and the liquid crystal display panel 4. The organic light-emitting diode display panel 3 includes a first organic light-emitting diode display panel 3a disposed in the first display region 1 and a second organic light-emitting diode display panel 3b in the second display region 2. In a display stage, the first organic light-emitting diode display panel 3a emits light and is configured as the backlight for the liquid crystal display panel 4, the liquid crystal display panel 4 is used for displaying image information to be displayed in the first display region 1, and the second organic light-emitting diode display panel 3b is used for displaying image information to be displayed in the second display region 2, ensuring a normal display of the whole display panel. Furthermore, the liquid crystal display panel 4 includes the plurality of first sub-pixels 51, and the plurality of first sub-pixels 51 have the first sub-pixel density; the organic light-emitting function film 32 in the second display region 2 includes the plurality of second sub-pixels 52, and the plurality of second sub-pixels 52 have the second sub-pixel density, where the first sub-pixel density is the same as the second sub-pixel density. In this way, it is ensured that the number of image points (sub-pixels) that may perform the display in a unit area of the display panel in the first display region 1 is the same as the number of image points (sub-pixels) that may perform the display in the unit area of the display panel in the second display region 2, ensuring same display fineness of the first display region 1 and the second display region 2, and ensuring good uniformity of display effects of the first display region 1 and the second display region 2.

As for an organic light-emitting diode display panel in the related art, when the same display effect of the first display region 1 and the second display region 2 is ensured, a density of sub-pixels in the first display region 1 is the same as a density of sub-pixels in the second display region 2, and therefore a density of a pixel driving circuit in the first display region 1 is the same as a density of a pixel driving circuit in the second display region 2. Since the organic light-emitting diode display panel 3 has a complex pixel driving circuit (for example, a 7T1C circuit), and the pixel driving circuit includes a plurality of electronic elements and covers a larger area, which leads to a smaller light-transmissive area of the first display region 1, the sensor disposed in the first display region 1 is unable to receive a luminous flux to ensure its normal work and thus has a lower working accuracy and a lower a working sensitivity. In the embodiments of the present disclosure, the first organic light-emitting diode display panel 3a in the first display region is configured as the backlight for the liquid crystal display panel 4, and the first organic light-emitting diode display panel 3a is not used for the display, so that the density of the first A-type pixel driving circuit 3111 for driving the organic light-emitting function film 32a in the first display region 1 to emit light may be less than the density of the first B-type pixel driving circuit 3112 used for driving the organic light-emitting function film 32b in the second display region 2 to emit light. In this way, the first organic light-emitting diode display panel 3a has a larger light-transmissive area and the sensor disposed in the first display region 1 can receive a greater luminous flux, ensuring a higher working accuracy and a higher working sensitivity of the sensor.

It is to be noted that the liquid crystal display panel 4 provided by the embodiments of the present disclosure may be an actively-driving liquid crystal display panel, and a pixel driving circuit is configured in the liquid crystal display panel to drive the liquid crystal to deflect; or the liquid crystal display panel 4 may also be a passively-driven liquid crystal display panel, electrical signals are inputted into two electrodes of the liquid crystal display panel, and the liquid crystal deflects under the control of the electrical signals, which is not limited in the embodiments of the present disclosure. FIG. 3 merely illustrates the liquid crystal display panel 4 as the passively-driven liquid crystal display panel for description. It is to be understood that the pixel driving circuit in the liquid crystal display panel has a simple structure, for example, may be a 1T (one thin film transistor) circuit. Comparing with the 7T1C (seven thin film transistors and one capacitor) circuit in the organic light-emitting diode display panel, the pixel driving circuit in the liquid crystal display panel has a greatly reduced number of electronic elements. Even the liquid crystal display panel 4 is the actively-driving liquid crystal display panel, a light transmittance of the first display region 1 in the technical solution provided by the embodiments of the present disclosure is much greater than a light transmittance of the first display region 1 in the related art, ensuring that the solution in the embodiments of the present disclosure provides a greater light transmittance and good display uniformity.

In summary, in the display panel provided by the embodiments of the present disclosure, the density of the first A-type pixel driving circuit for driving the organic light-emitting function film in the first display region to emit light is less than the density of the first B-type pixel driving circuit for driving the organic light-emitting function film in the second display region to emit light, and the density of the first sub-pixels in the liquid crystal display panel is the same as the density of the second sub-pixels in the second display region, ensuring that the first display region has a larger light-transmissive area and the first display region and the second display region have the same display fineness. The display panel provided by the embodiments of the present disclosure has beneficial effects of a high light transmittance and the good uniformity of display effects.

Specifically, the density of the first A-type pixel driving circuit is less than the density of the first B-type pixel driving circuit and the first sub-pixel density is the same as the second sub-pixel density, which are configured in multiple implementation modes, and two feasible implementation modes are taken as an example for description.

Optionally, still referring to FIG. 2 and FIG. 3, the organic light-emitting function film 32 in the first display region 1 includes a plurality of third sub-pixels 53, where the plurality of third sub-pixels 53 are disposed in one-to-one correspondence with the plurality of first sub-pixels 51, and a vertical projection of each third sub-pixel 53 on a plane where the plurality of first sub-pixels 51 are located covers one first sub-pixel 51 corresponding to the each third sub-pixel 53. Each first A-type pixel driving circuit 3111 is used for driving at least two third sub-pixels 53 to emit light.

Exemplarily, as shown in FIG. 2 and FIG. 3, the organic light-emitting function film 32 in the first display region 1 includes the plurality of third sub-pixels 53, and the plurality of third sub-pixels 53 and the plurality of second sub-pixels 52 both are organic light-emitting diodes. In the technical solution in the embodiments of the present disclosure, since the amount of light transmitted through the first display region 1 is increased by configuring the density of the first A-type pixel driving circuit 3111 to be less than the density of the first B-type pixel driving circuit 3112, a density of the third sub-pixels 53 in the first display region 1 and a density of the second sub-pixels 52 in the second display region 2 are not limited, and the density of the third sub-pixels 53 may be the same as the density of the second sub-pixels 52. As shown in FIG. 2 and FIG. 3, in this case, the sub-pixels 53 are disposed in one-to-one correspondence with the first sub-pixels 51. Since a light-emitting area of each sub-pixel in the organic light-emitting diode display panel is greater than a light-emitting area of each sub-pixel in the liquid crystal display panel, the vertical projection of each third sub-pixel 53 on the plane where the plurality of first sub-pixels 51 are located covers the first sub-pixel 51 corresponding to the each third sub-pixel 53, and the each third sub-pixel 53 is configured as the backlight for the first sub-pixel 51 corresponding to the each third sub-pixel 53. Furthermore, since the density of the third sub-pixels 53 is the same as the density of the second sub-pixels 52, and the density of the first A-type pixel driving circuit 3111 used for driving the third sub-pixels 53 to emit light is less than the density of the first B-type pixel driving circuit 3112 used for driving the second sub-pixels 52 to emit light, each first A-type pixel driving circuit 3111 drives at least two third sub-pixels 53 to emit light. FIG. 3 merely illustrates that each first A-type pixel driving circuit 3111 drives two third sub-pixels 53 to emit light for description. Since the first organic light-emitting diode display panel 3a in the first display region 1 is not used for the display, and each third sub-pixel 53 does not need to be configured with a separate pixel driving circuit, each first A-type pixel driving circuit 3111 is configured to drive two third sub-pixels 53 to emit light, and it is merely necessary to ensure that each third sub-pixel 53 may emit light and be configured as the backlight for the liquid crystal display panel 4, ensuring the high light transmittance and the good display uniformity of the display panel.

It is to be noted that the embodiments of the present disclosure do not limit how to enable each first A-type pixel driving circuit 3111 to drive at least two third sub-pixels 53 to emit light; as shown in FIG. 3, the at least two third sub-pixels driven by a same first A-type pixel driving circuit 3111 may share a same anode; or anodes of the at least two third sub-pixels driven by the same first A-type pixel driving circuit 3111 are electrically connected through a conductive layer (not shown in the figure); or the anodes of the at least two third sub-pixels driven by the same first A-type pixel driving circuit 3111 both are electrically connected to the same first A-type pixel driving circuit 3111 through punched holes (not shown in the figure), which is not limited in the embodiments of the present disclosure.

Figure 4:
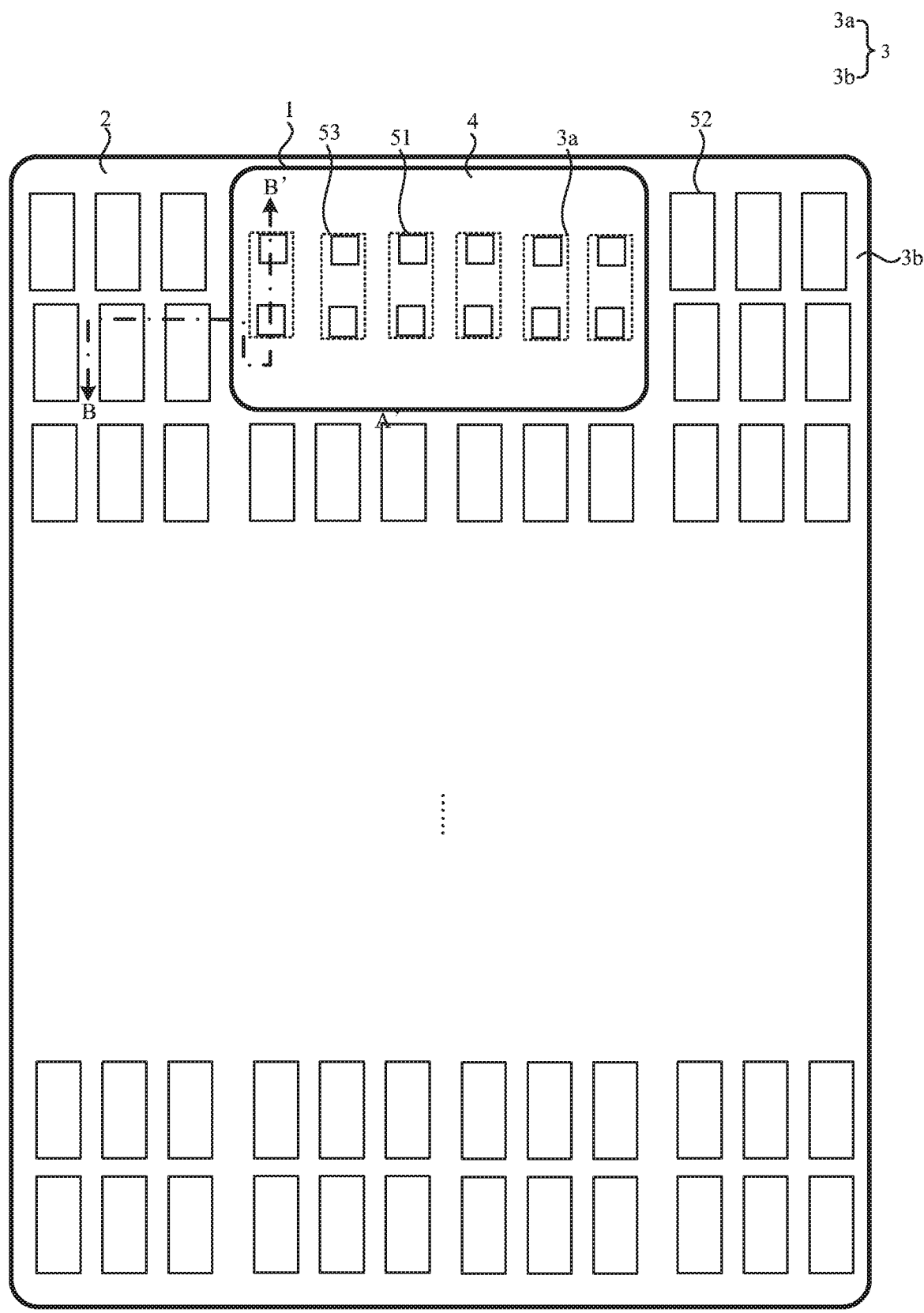
FIG. 4 is a structural diagram of another display panel according to an embodiment of the present disclosure.
Figure 5:
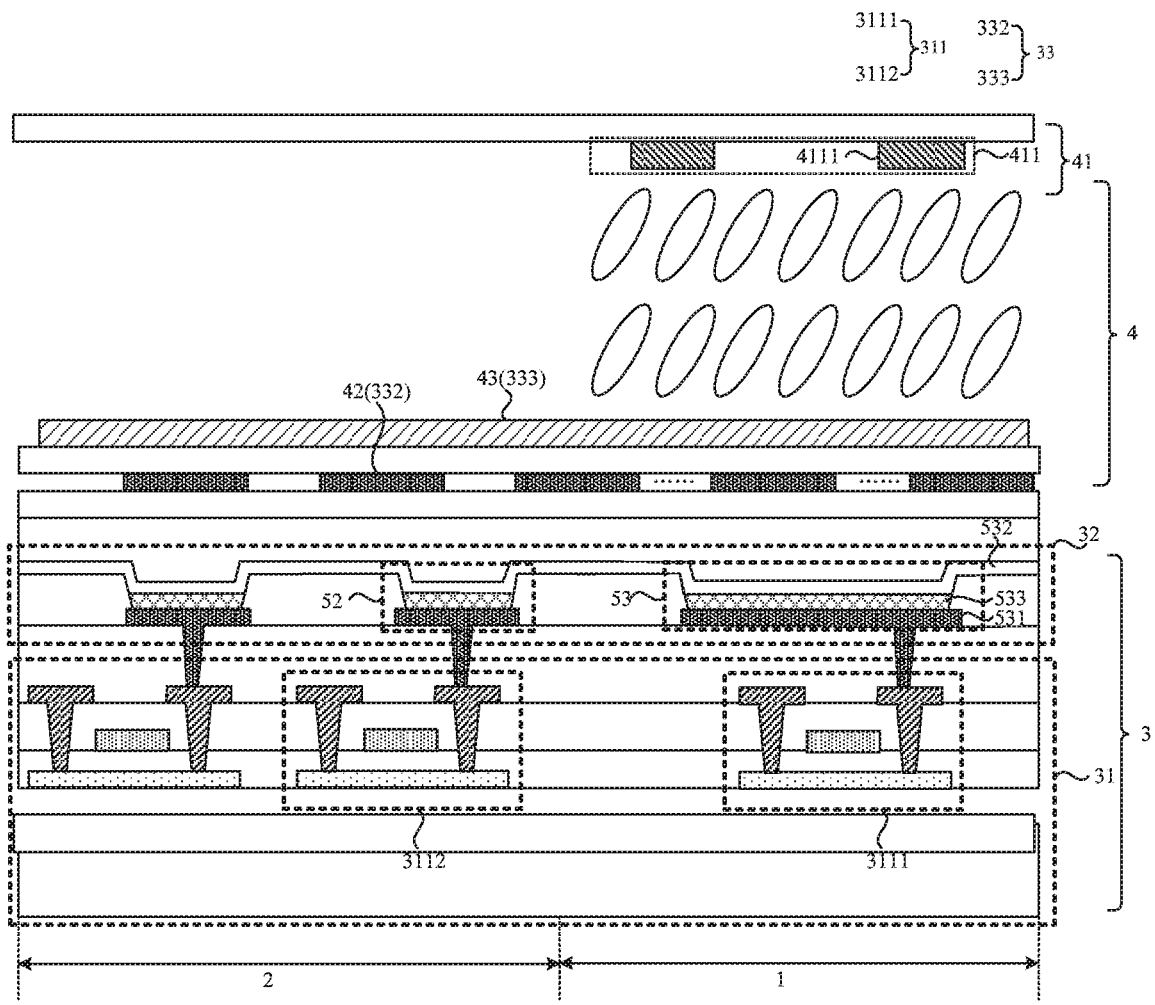
FIG. 5 is a sectional view of the display panel shown in FIG. 4 taken along a section line B-B'.

Optionally, FIG. 4 is a structural diagram of another display panel according to an embodiment of the present disclosure. FIG. 5 is a sectional view of the display panel shown in FIG. 4 taken along a section line B-B'. As shown in FIG. 4 and FIG. 5, the organic light-emitting function film 32 in the first display region 1 includes the plurality of third sub-pixels 53, where the vertical projection of each third sub-pixel 53 on the plane where the plurality of first sub-pixels 51 are located covers at least two of the plurality of first sub-pixels 51, and one first A-type pixel driving circuit 3111 is used for driving one third sub-pixel 53 to emit light.

Exemplarily, in the technical solution in the embodiments of the present disclosure, since the amount of light transmitted through the first display region 1 is increased by configuring the density of the first A-type pixel driving circuit 3111 to be less than the density of the first B-type pixel driving circuit 3112, the density of the third sub-pixels 53 in the first display region 1 and the density of the second sub-pixels 52 in the second display region 2 are not limited, and the density of the third sub-pixels 53 may be less than the density of the second sub-pixels 52, that is, the density of the third sub-pixels 53 is less than the density of the first sub-pixels 51. As shown in FIG. 4 and FIG. 5, in this case, each sub-pixel 53 is configured as the backlight for at least two first sub-pixels 51. Since the light-emitting area of each sub-pixel in the organic light-emitting diode display panel is greater than the light-emitting area of each sub-pixel in the liquid crystal display panel, the vertical projection of each third sub-pixel 53 on the plane where the plurality of first sub-pixels 51 are located covers at least two first sub-pixels 51. FIG. 4 and FIG. 5 merely illustrates that the vertical projection of each third sub-pixel 53 on the plane where the plurality of first sub-pixels 51 are located covers two first sub-pixels 51 for description. Furthermore, each first A-type pixel driving circuit 3111 is used for driving one third sub-pixel 53 to emit light, the first A-type pixel driving circuit 3111 has a one-to-one correspondence with the third sub-pixel 53, and the first A-type pixel driving circuit 3111 drives one third sub-pixel 53 to emit light as the backlight for at least two first sub-pixels 51, ensuring the high light transmittance and the good display uniformity of the display panel.

It is to be noted that the embodiments described above merely describe an example in which each first A-type pixel driving circuit 3111 drives two third sub-pixels 53 to emit light as the backlight for two first sub-pixels 51 or an example in which each first A-type pixel driving circuit 3111 drives one third sub-pixel 53 to emit light as the backlight for two first sub-pixels 51, and in practice, the density of the first A-type pixel driving circuit in the first display region may be further reduced to improve the light transmittance of the first display region. For example, each first A-type pixel driving circuit 3111 drives 20 third sub-pixels 53 to emit light as the backlight for 20 first sub-pixels 51, or each first A-type pixel driving circuit 3111 drives one third sub-pixel 53 to emit light as the backlight for 20 first sub-pixels 51. The density of the first A-type pixel driving circuit 3111 may be reduced so long as the display uniformity is satisfied.

In summary, the above-mentioned embodiments describe how to implement the technical solution in which the density of the first A-type pixel driving circuit is less than the density of the first B-type pixel driving circuit and the first sub-pixel density is the same as the second sub-pixel density through two feasible implementation modes. It may be known from the above-mentioned embodiments that the technical solution in the embodiments of the present disclosure is practical and feasible, and the display panel has a simple design, fully ensuring the high light transmittance of the first display region and the good display uniformity of the whole display panel.

Optionally, still referring to FIG. 3 and FIG. 5, based on the above-mentioned embodiments, the third sub-pixel 53 includes an anode electrode 531, a cathode electrode 532 and an organic light-emitting layer 533 between the anode electrode 531 and the cathode electrode 532, where the anode electrode 531 and the cathode electrode 532 are transparent electrodes.

Exemplarily, the anode electrode 531 and the cathode electrode 532 of the third sub-pixel 53 are configured as the transparent electrodes, further improving the light transmittance of the first display region 1 and improving the working accuracy and the working sensitivity of the sensor.

Furthermore, since the third sub-pixels 53 disposed in the first display region 1 are configured as the backlight for the liquid crystal display panel 4, in order to ensure that backlight light provided by the backlight does not affect the normal display of the liquid crystal display panel 4, the light emitted by the backlight may be white light; therefore, in the technical solution in the embodiments of the present disclosure, each third sub-pixel 53 may emit the white light independently. Specifically, the organic light-emitting layer 533 of the third sub-pixel 53 may include stacked organic light-emitting material layers of three different colors, such as a red organic light-emitting material layer, a green organic light-emitting material layer, and a blue organic light-emitting material layer, which ensures that the white light is obtained after the light is transmitted through the organic light-emitting material layers of three different colors, and does not interfere with the normal display of the liquid crystal display panel. Specifically, when a red sub-pixel is evaporated using a first mask plate, the red sub-pixel in the second display region is configured with a corresponding opening, and each third sub-pixel in the first display region is configured with an opening, which are evaporated at the same time; when a green sub-pixel is evaporated using a second mask plate, the green sub-pixel in the second display region is configured with a corresponding opening, and each third sub-pixel in the first display region is configured with an opening, which are evaporated at the same time; when a blue sub-pixel is evaporated using a third mask plate, the blue sub-pixel in the second display region is configured with a corresponding opening, and each third sub-pixel in the first display region is configured with an opening, which are evaporated at the same time. In this way, a white sub-pixel in the first display region may be evaporated merely by using an existing evaporation process of common red, green and blue sub-pixels without additional process steps, reducing manufacturing costs.

Optionally, still referring to FIG. 3 and FIG. 5, based on the above-mentioned embodiments, the liquid crystal display panel 4 may include a color filter substrate 41, the color filter substrate 41 includes a first color resist layer 411, and the first color resist layer 411 includes a plurality of tiled color resist blocks 4111 of different colors, where each color resist block 4111 has a same area as an opening of each second sub-pixel 52, and a region between any two adjacent color resist blocks 4111 is a transparent region.

Exemplarily, the color resist blocks 4111 of different colors may include a red color resist block, a green color resist block and a blue color resist block, and each color resist block corresponds to one first sub-pixel 51. When the first sub-pixel 51 has a same pixel density as the second sub-pixel 52, an area of each color resist block 4111 is configured to be the same as an area of the opening of the second sub-pixel 52, further ensuring that the first display region 1 has a same light-emitting area as the second display region 2, and ensuring the good uniformity of display effects of the first display region 1 and the second display region 2. Furthermore, different from a solution in the related art in which a black matrix is configured between two adjacent color resist blocks, the technical solution in the embodiments of the present disclosure in which the region between any two adjacent color resist blocks 4111 is light-transmissive further improves the light transmittance of the first display region 1, and ensures that the sensor disposed in the first display region 1 can receive the greater luminous flux, ensuring the working accuracy and the working sensitivity of the sensor.

Figure 6:
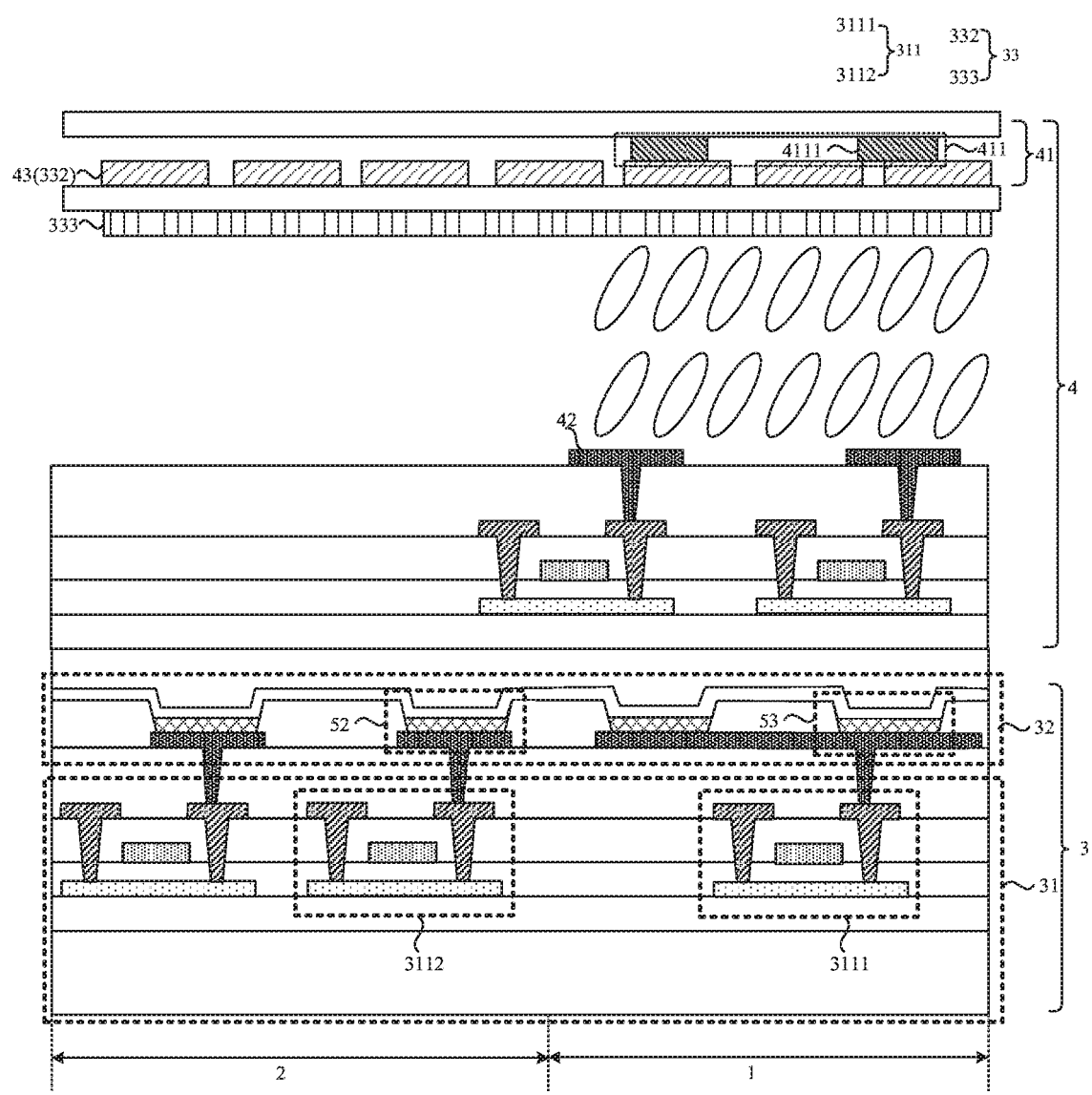
FIG. 6 is another sectional view of the display panel shown in FIG. 2 taken along a section line A-A'.

FIG. 6 is another sectional view of the display panel shown in FIG. 2 along the section line A-A'. As shown in FIG. 3, FIG. 5 and FIG. 6, the liquid crystal display panel 4 may be attached on the light-emitting side of the organic light-emitting diode display panel. FIG. 3 and FIG. 5 illustrate the passively-driven liquid crystal display panel for description, and FIG. 6 illustrates the actively-driving liquid crystal display panel for description. Furthermore, the organic light-emitting diode display panel 3 may further include touch electrodes 33, and the liquid crystal display panel 4 may further include pixel electrodes 42 and common electrodes 43, where the pixel electrodes 42 and/or the common electrodes 43 may be reused as the touch electrodes 33 of the organic light-emitting diode display panel 3. In this way, a film configuration of the display panel can be simplified, ensuring a simple film configuration of the display panel and a simple manufacturing process of the display panel.

Different cases where the pixel electrodes 42 and/or the common electrodes 43 are reused as the touch electrodes 33 are described below.

Optionally, still referring to FIG. 3, each of the touch electrodes 33 in the organic light-emitting diode display panel 3 may be a self-capacitive touch electrode, where the self-capacitive touch electrode may include a first touch electrode 331, and each of the common electrodes 43 is reused as the first touch electrode 331.

Exemplarily, in the display stage, the common electrodes 43 receive a common signal and work together with the pixel electrodes 42 to control the liquid crystal to deflect and achieve the normal display of the first display region 1. In a touch stage, the common electrodes 43 (the first touch electrodes 331) receive a touch signal to perform a touch identification.

Furthermore, each common electrode 43 is configured to be reused as the first touch electrode 331, which can ensure the simple film configuration of the display panel and the simple manufacturing process of the display panel.

Optionally, still referring to FIG. 5, each of the touch electrodes 33 is a mutual-capacitive touch electrode, where the mutual-capacitive touch electrode includes a second touch electrode 332 and a third touch electrode 333; the pixel electrodes 42 intersect with the common electrodes 43, and the liquid crystal display panel includes N rows of first sub-pixels 51 extending along an extension direction of the pixel electrodes 42 or the common electrodes 43, where 1≤N≤100, and N is a positive integer; each of the pixel electrodes 42 is reused as the second touch electrode 332 and each of the common electrodes 43 is reused as the third touch electrode 333; and in the display stage, the pixel electrodes 42 and the common electrodes 43 are used for driving a liquid crystal layer corresponding to first sub-pixels 51 in a same row to deflect simultaneously.

Exemplarily, when the touch electrode 33 is the mutual-capacitive touch electrode, the touch electrode 33 may include the second touch electrode 332 and the third touch electrode 333, and the second touch electrode 332 and the third touch electrode 333 may be configured as a touch driving electrode and a touch sensing electrode respectively. The second touch electrode 332 and the third touch electrode 333 may be arranged at a same layer or may be arranged at different layers, which is not limited in the embodiments of the present disclosure. FIG. 5 merely illustrates that the second touch electrode 332 and the third touch electrode 333 are arranged at different layers for description. In the display stage, the pixel electrodes 42 receive a pixel signal, the common electrodes 43 receive the common signal, and the pixel electrodes 42 work together with the common electrodes 43 to control the liquid crystal to deflect and achieve the normal display of the first display region 1. In the touch stage, the pixel electrodes 42 (the second touch electrodes 332) receive the touch signal, the common electrodes 43 (the third touch electrodes 333) generate a touch sensing signal, and the pixel electrodes 42 (the second touch electrodes 332) receive the touch signal and work together with the common electrodes 43 (the third touch electrodes 333) to achieve the touch identification. Furthermore, the liquid crystal display panel 4 shown in FIG. 5 is passively driven, the pixel electrodes 42 do not receive a display driving signal and directly receive the pixel signal, and the liquid crystal display panel 4 directly performs the display based on the pixel signal and the common signal directly received by the common electrodes 43 and has a simple driving method. Furthermore, in order to ensure the normal display of the liquid crystal display panel 4 when the liquid crystal display panel 4 is passively driven, along the extension direction of the pixel electrodes 42 or the common electrodes 43, the number of rows N of the first sub-pixels 51 included in the liquid crystal display panel 4 needs to satisfy 1≤N≤100. FIG. 5 illustrates the extension direction of the common electrodes 43 (an X direction shown in the figure) for description, and in this case, in order to ensure the normal display, along the extension direction of the common electrodes 43, the number of rows of the first sub-pixels 51 in the liquid crystal display panel 4 is not very great, for example, not greater than 100, ensuring that the liquid crystal display panel 4 is passively driven at a high frequency and ensuring the normal display of the liquid crystal display panel 4.

Furthermore, each of the pixel electrodes 42 is configured to be reused as the second touch electrode 332 and each of the common electrodes 43 is configured to be reused as the third touch electrode 333, which can ensure the simple film configuration of the display panel and the simple manufacturing process of the display panel.

Optionally, still referring to FIG. 6, each of the touch electrodes 33 may be the mutual-capacitive touch electrode, the mutual-capacitive touch electrode includes the second touch electrode 332 and the third touch electrode 333, and each of the common electrodes is reused as the second touch electrode 332 or the third touch electrode 333.

Exemplarily, when the touch electrode 33 is the mutual-capacitive touch electrode, the touch electrode 33 may include the second touch electrode 332 and the third touch electrode 333, and the second touch electrode 332 and the third touch electrode 333 may be configured as the touch driving electrode and the touch sensing electrode respectively. The second touch electrode 332 and the third touch electrode 333 may be arranged at the same layer or may be arranged at different layers, which is not limited in the embodiments of the present disclosure. FIG. 6 merely illustrates that the second touch electrode 332 and the third touch electrode 333 are arranged at different layers for description. FIG. 6 illustrates that the common electrode 43 is reused as the second touch electrode 332 for description. As shown in FIG. 6, in the display stage, the common electrodes 43 receive the common signal and work together with the pixel electrodes 42 to control the liquid crystal to deflect and achieve the normal display of the first display region 1; and in the touch stage, the common electrodes 43 (the second touch electrodes 332) receive the touch driving signal or the touch sensing signal generated based on the touch driving signal to perform the touch identification.

Furthermore, the common electrode 43 is configured to be reused as the first touch electrode 331, which can ensure the simple film configuration of the display panel and the simple manufacturing process of the display panel.

In summary, the above-mentioned embodiments illustrate different cases where the pixel electrodes 42 and/or the common electrodes 43 are reused as the touch electrodes 33. The pixel electrodes 42 and/or the common electrodes 43 are reused as the touch electrodes 33, which can ensure the simple film configuration of the display panel and the simple manufacturing process of the display panel.

It is to be understood that FIG. 3 and FIG. 6 illustrate that the liquid crystal display panel is a twisted nematic (TN) liquid crystal display panel, and FIG. 5 illustrates that the liquid crystal display panel is a fringe field switching (FFS) liquid crystal display panel. Furthermore, the liquid crystal display panel may further be an in-plane-switching (IPS) liquid crystal display panel. The embodiments of the present disclosure do not limit a form of the liquid crystal display panel.

Optionally, still referring to FIG. 3, the organic light-emitting diode display panel 3 provided by the embodiments of the present disclosure may further include an encapsulation layer 34, where the liquid crystal display panel 4 is reused as the encapsulation layer 34.

Exemplarily, since the organic light-emitting diode display panel is susceptible to water and oxygen corrosion and its service life is affected, the organic light-emitting diode display panel needs to be configured with the encapsulation layer 34. In the embodiments of the present disclosure, the liquid crystal display panel 4 is reused as the encapsulation layer 34, that is, provide water and oxygen protection for the organic light-emitting diode display panel, and at the same time, the whole display panel has simple films and the simple manufacturing process.

Figure 7:
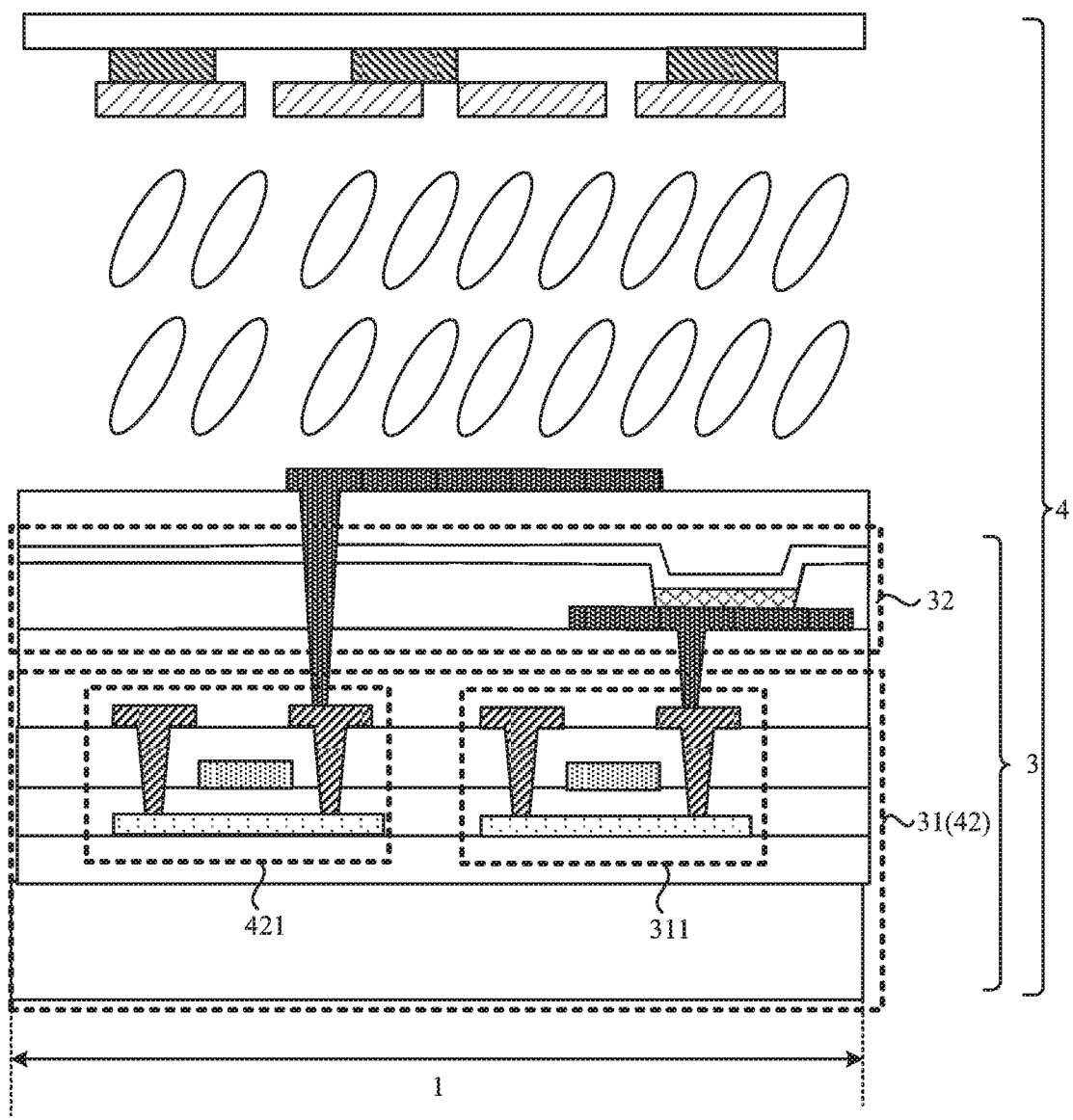
FIG. 7 is a sectional view of the display panel shown in FIG. 2 taken along a section line C-C'.

Optionally, FIG. 7 is a sectional view of the display panel shown in FIG. 2 taken along a section line C-C'. As shown in FIG. 7, the liquid crystal display panel 4 further includes a second array substrate 42, the second array substrate 42 includes a second pixel driving circuit 421, where the second pixel driving circuit 421 and the first pixel driving circuit 311 are arranged at a same layer.

Exemplarily, when the liquid crystal display panel is the actively-driving liquid crystal display panel, the liquid crystal display panel further includes the second array substrate 42, the second array substrate 42 includes the second pixel driving circuit 421 used for providing a pixel driving signal, and the second pixel driving circuit 421 may include a thin film transistor and the first pixel driving circuit 311 may also include the thin film transistor. Since the second pixel driving circuit 421 may have a same structure as the first pixel driving circuit 311, the second pixel driving circuit 421 and the first pixel driving circuit 311 may be arranged at the same layer and be prepared in a same manufacturing process with a same material, ensuring a simple film relationship of the display panel and the simple manufacturing process of the display panel.

Figure 8:
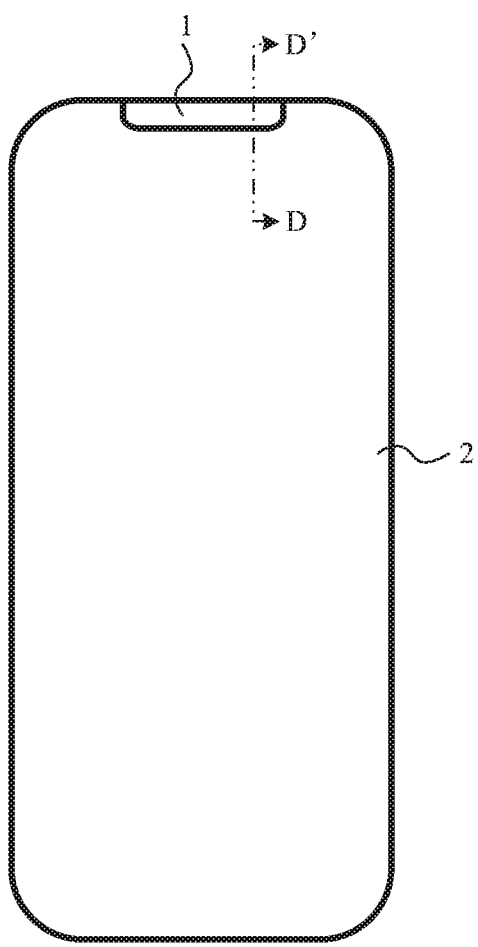
FIG. 8 is a top view of a display device according to an embodiment of the present disclosure.
Figure 9:
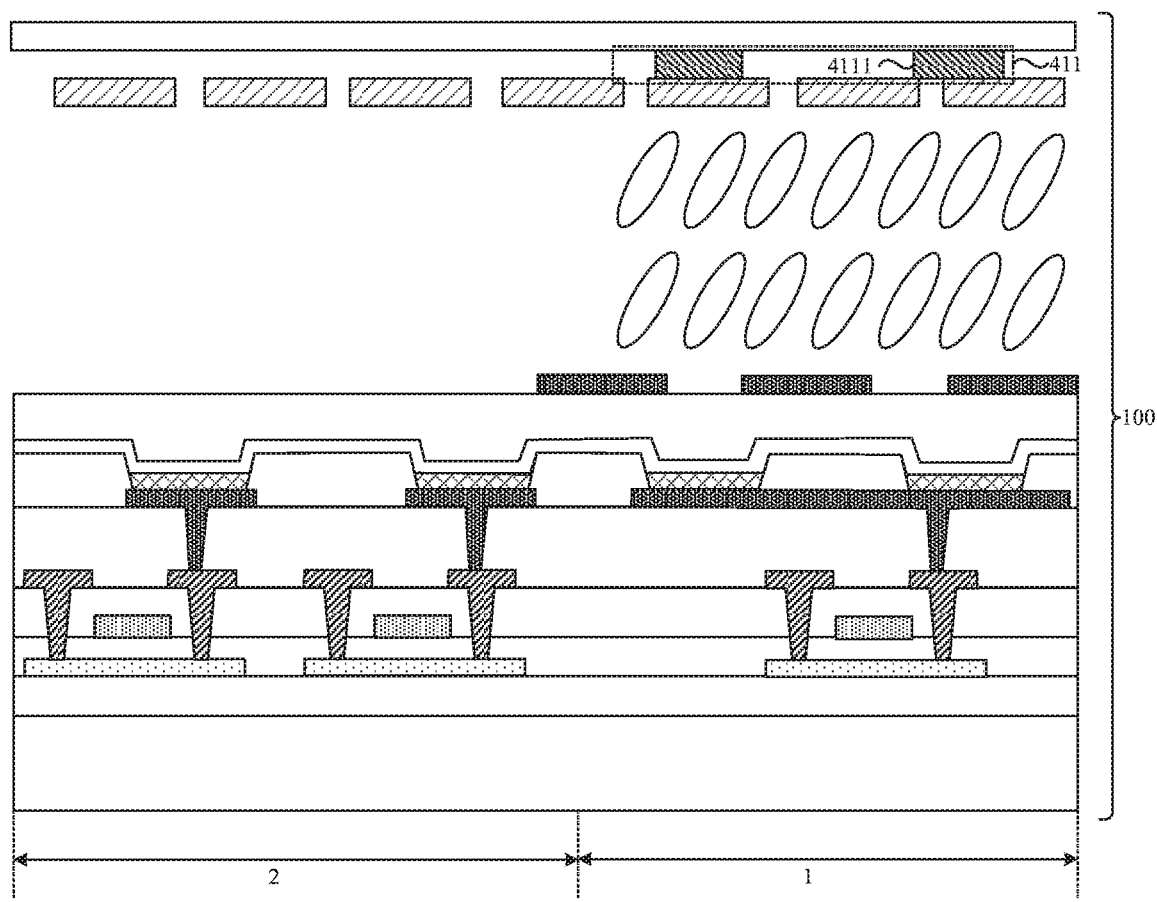
FIG. 9 is a sectional view of the display device shown in FIG. 8 taken along a section line D-D'.

Based on the same inventive concept, an embodiment of the present disclosure further provides a display device. FIG. 8 is a top view of a display device according to an embodiment of the present disclosure, and FIG. 9 is a sectional view of the display panel shown in FIG. 8 taken along a section line D-D'. As shown in FIG. 8 and FIG. 9, the display device provided by the embodiments of the present disclosure includes a display panel 100 according to any embodiment of the present disclosure and a sensor 200. The display panel 100 includes a first display region 1 and a second display region 2, the first display region 1 is reused as a sensor reservation region, and the sensor 200 is disposed in the sensor reservation area. Optionally, the sensor provided by the embodiment of the present disclosure may include one or more of a camera module, a photosensitive sensor, and an ultrasonic distance sensor. The display device may be a mobile phone shown in FIG. 8, and may also be a computer, a television, a smart wearable display device (for example, a smart watch), a vehicle-mounted display device and the like, which is not limited in the embodiment of the present disclosure.

Figure 10:
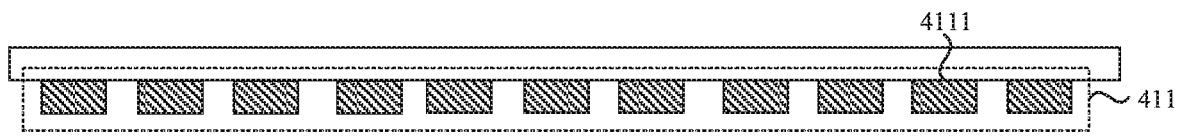
FIG. 10 is a structural diagram of another display device according to an embodiment of the present disclosure.

Optionally, FIG. 10 is a structural diagram of another display device according to an embodiment of the present disclosure, and FIG. 10 merely exemplarily shows a first color resist layer 411 and a camera module 201. In conjunction with FIG. 9 and FIG. 10, a liquid crystal display panel further includes a color filter substrate. The color filter substrate includes the first color resist layer 411, and the first color resist layer 411 includes a plurality of tiled color resist blocks 4111 of different colors. The camera module 201 includes a second color resist layer, and the second color resist layer includes a plurality of tiled color resist blocks of different colors, where the second color resist layer is reused as the first color resist layer 411.

Exemplarily, when the sensor 200 is the camera module 201, the camera module 201 is configured with the second color resist layer for the camera module 201 to perform normal shooting and obtain a color image. When a display resolution of the camera module 201 is the same as a display resolution of the liquid crystal display panel, the second color resist layer in the camera module 201 may be configured to be reused as the first color resist layer 411 in the liquid crystal display panel. In this way, the first color resist layer 411 does not affect normal imaging of the camera module 201, and substitutes the second color resist layer in the camera module 201, saving costs of the camera module 201.

Figure 11:
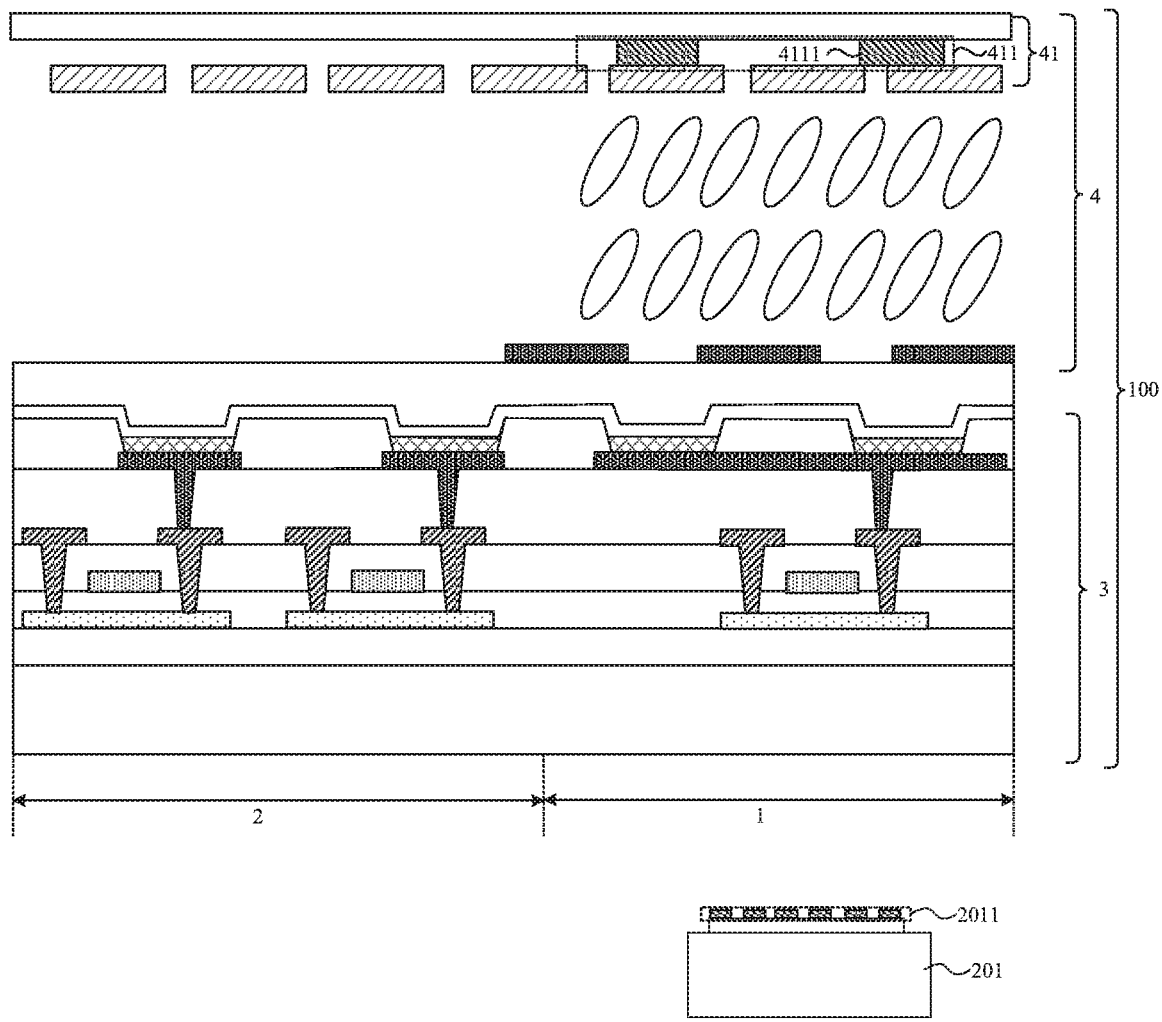
FIG. 11 is a structural diagram of another display device according to an embodiment of the present disclosure.
Figure 12:
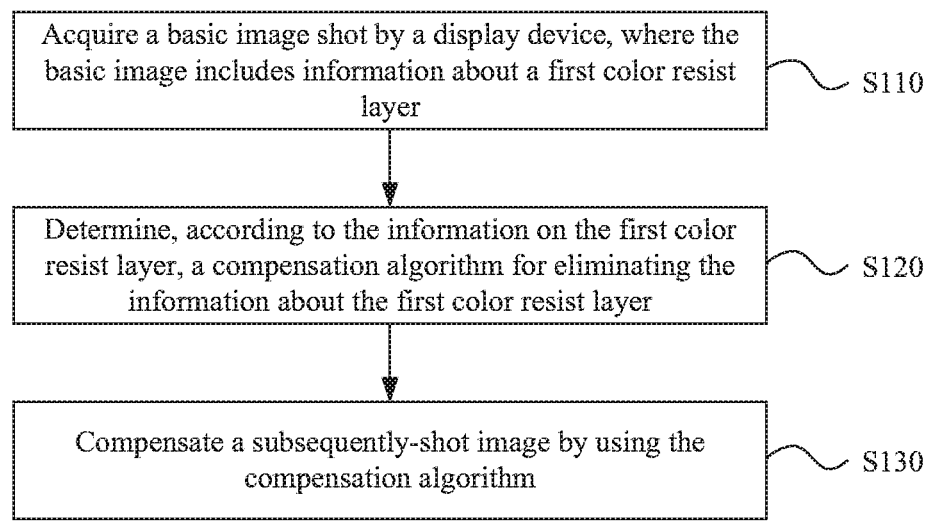
FIG. 12 is a flowchart of a compensation method for a display device according to an embodiment of the present disclosure.

Based on the same inventive concept, an embodiment of the present disclosure further provides a compensation method for a display device, which is specifically used for compensating the display device in a camera process. Specifically, FIG. 11 is a structural diagram of another display device according to an embodiment of the present disclosure. As shown in FIG. 11, the display device includes a liquid crystal display panel 4, an organic light-emitting diode display panel 3 and a camera module 201, where the liquid crystal display panel includes a color filter substrate 41, and the color filter substrate 41 includes a first color resist layer 411; and the camera module 201 includes a second color resist layer 2011. The compensation method provided by the embodiment of the present disclosure is used for compensating the display device shown in FIG. 11 at a camera shooting stage. Specifically, FIG. 12 is a flowchart of a compensation method for a display device according to an embodiment of the present disclosure. As shown in FIG. 12, the compensation method for a display device according to the embodiment of the present disclosure includes steps described below.

In S110, a basic image shot by the display device is acquired, where the basic image includes information about the first color resist layer.

In S120, a compensation algorithm is determined according to the information about the first color resist layer, where the compensation algorithm is used for eliminating the information about the first color resist layer.

In S130, a subsequently-shot image is compensated by using the compensation algorithm.

Exemplarily, generally speaking, a display resolution of the camera module 201 is much greater than a display resolution of the liquid crystal display panel, and therefore the first color resist layer 411 in the liquid crystal display panel provides interference light for the camera module 201, thereby affect normal shooting of the camera module 201. Therefore, in the compensation algorithm provided by the embodiment of the present disclosure, the basic image shot by the display device is acquired, where the basic image includes the information about the first color resist layer; the compensation algorithm is determined according to the information about the first color resist layer, where the compensation algorithm is used for eliminating the information about the first color resist layer; finally, the subsequently-shot image is compensated by using the compensation algorithm obtain above to ensure that a final photographic image does not include the information about the first color resist layer.

In summary, the compensation method for a display device provided by the embodiment of the present disclosure is specifically used for compensating the shooting process of the camera module, eliminating interference of the first color resist layer of the liquid crystal display panel on the image obtained by the camera module, and ensuring that a normal photographic image without interference is obtained based on the camera module.

Optionally, the interference of the first color resist layer on the camera module may be eliminated in multiple different implementation modes, and two feasible implementation modes are described below.

Optionally, based on the above-mentioned embodiment, the first color resist layer includes a plurality of tiled color resist blocks of different colors.

Acquiring the basic image shot by the display device may include acquiring a first basic image shot by the display device according to a preset image, where the preset image includes known image information, and the first basic image includes the information about the first color resist layer.

Determining, according to the information about the first color resist layer, the compensation algorithm for eliminating the information about the first color resist layer may include determining a first compensation algorithm according to the preset image and the first basic image, where the first compensation algorithm is used for eliminating the information about the first color resist layer.

Exemplarily, the preset image may be a white image, the first basic image is shot and obtained by the display device based on the white image; the first compensation algorithm is determined according to the obtained first basic image and the white image, where the first compensation algorithm is used for eliminating the information about the first color resist layer included in the first basic image; and finally, the subsequently-shot image is compensated by using the first compensation algorithm. Specifically, when the first basic image is shot and obtained by the display device based on the white image, a sensor unit under a red color resist shoots a red image; since it is known that the shot image is a white image, the red image may be compensated to the white image through the compensation algorithm. Sensor units under green and blue color resist are similar. When a photo is shot next time, the photo is compensated to obtain an image without a color cast.

Due to the high speed development of cameras of the mobile phone, all the existing camera modules have an optical image stabilization function, and the cameras may be accurately deviated. Optionally, the first color resist layer includes a plurality of tiled red color resist blocks, a plurality of tiled green color resist blocks and a plurality of tiled blue color resist blocks.

The acquiring the basic image shot by the display device includes acquiring a plurality of basic images shot by the display device, where the plurality of basic images include at least a second basic image including information about the plurality of red color resist blocks, a third basic image including information about the plurality of green color resist blocks and a fourth basic image including information about the plurality of blue color resist blocks.

Determining, according to the information about the first color resist layer, the compensation algorithm for eliminating the information about the first color resist layer includes configuring a superposition operation of the second basic image, the third basic image and the fourth basic image as a second compensation algorithm, where the second compensation algorithm is used for eliminating the information about the plurality of red color resist blocks, the information about the plurality of green color resist blocks and the information about the plurality of blue color resist blocks.

Exemplarily, the plurality of basic images shot by the display device are acquired, where the plurality of basic images include at least the second basic image including the information about the plurality of red color resist blocks, the third basic image including the information about the plurality of green color resist blocks and the fourth basic image including the information about the plurality of blue color resist blocks; the superposition operation of the second basic image, the third basic image and the fourth basic image is used for eliminating the information about the plurality of red color resist blocks, the information about the plurality of green color resist blocks and the information about the plurality of blue color resist blocks to ensure that a normal photographic image without the information about the first color resist layer is obtained.

Furthermore, when a low-resolution camera is used under a screen, a color film of the camera may be removed, and a color film in the liquid crystal display panel is used as the color film of the camera to avoid the color cast.

The two feasible compensation modes are used for describing how to compensate the display device provided by the embodiments of the present disclosure in the camera shooting stage. Based on the above-mentioned embodiments, it may be appreciated that the display device provided by the embodiments of the present disclosure may perform normal shooting, information about the shot image may not include interference information of the first color resist layer in the liquid crystal display panel, and the shot image is normal. It is to be noted that the above are merely preferred embodiments of the present disclosure and the technical principles used therein. It will be understood by those skilled in the art that the present disclosure is not limited to the specific embodiments described herein, and that the features of the various embodiments of the present disclosure may be coupled or combined in part or in whole with each other, and may be collaborated with each other and technically driven in various ways.

Those skilled in the art can make various apparent modifications, adaptations, combinations and substitutions without departing from the scope of the present disclosure.

Therefore, while the present disclosure has been described in detail through the above-mentioned embodiments, the present disclosure is not limited to the above-mentioned embodiments and may further include more other equivalent embodiments without departing from the concept of the present disclosure. The scope of the present disclosure is determined by the scope of the appended claims.

What is claimed is:

1. A display panel, comprising: a first display region and a second display region, wherein the first display region is reused as a sensor reservation region;

wherein the display panel further comprises an organic light-emitting diode display panel and a liquid crystal display panel, wherein the organic light-emitting diode display panel is disposed in the first display region and the second display region, the liquid crystal display panel is disposed in the first display region and on a light-emitting side of the organic light-emitting diode display panel, and the organic light-emitting diode display panel in the first display region is configured as a backlight for the liquid crystal display panel;

wherein the organic light-emitting diode display panel comprises a first array substrate and an organic light-emitting function film, wherein the first array substrate comprises a first pixel drive circuit, the first pixel driving circuit comprises a first A-type pixel driving circuit and a first B-type pixel driving circuit, the first A-type pixel driving circuit is used for driving the organic light-emitting function film in the first display region to emit light, the first B-type pixel driving circuit is used for driving the organic light-emitting function film in the second display region to emit light, and a density of the first A-type pixel driving circuit is less than a density of the first B-type pixel driving circuit; and wherein the liquid crystal display panel comprises a plurality of first sub-pixels, and the plurality of first sub-pixels have a first sub-pixel density; and wherein the organic light-emitting function film in the second display region comprises a plurality of second sub-pixels, and the plurality of second sub-pixels have a second sub-pixel density, wherein the first sub-pixel density is the same as the second sub-pixel density.

2. The display panel of claim 1, wherein the organic light emitting function film disposed in the first display region comprises a plurality of third sub-pixels;

wherein the plurality of third sub-pixels are disposed in one-to-one correspondence with the plurality of first sub-pixels, a vertical projection of each of the plurality of third sub-pixels on a plane where the plurality of first sub-pixels are located covers a first sub-pixel corresponding to the each of the plurality of third sub-pixels, and the first A-type pixel driving circuit each is used for driving at least two of the plurality of third sub-pixels to emit light.

3. The display panel of claim 1, wherein the organic light emitting function film disposed in the first display region comprises a plurality of third sub-pixels;

wherein a vertical projection of each of the plurality of third sub-pixels on a plane where the plurality of first sub-pixels are located covers at least two of the plurality of first sub-pixels, and one first A-type pixel driving circuit is used for driving one of the plurality of third sub-pixels to emit light.

4. The display panel of claim 2, wherein the each of the plurality of third sub-pixels comprises an anode electrode, a cathode electrode and an organic light-emitting layer disposed between the anode electrode and the cathode electrode; wherein the anode electrode and the cathode electrode are transparent electrodes.

5. The display panel of claim 1, wherein the liquid crystal display panel comprises a color filter substrate, wherein the color filter substrate comprises a first color resist layer, and wherein the first color resist layer comprises a plurality of tiled color resist blocks of different colors; wherein each of the plurality of color resist blocks has a same area as an opening of each of the plurality of second sub-pixels; and a region between any two adjacent color resist blocks is a transparent region.

6. The display panel of claim 1, wherein the liquid crystal display panel is attached on the light-emitting side of the organic light-emitting diode display panel.

7. The display panel of claim 6, wherein the organic light-emitting diode display panel further comprises touch electrodes; and
wherein the liquid crystal display panel further comprises pixel electrodes and common electrodes, the pixel electrodes and/or the common electrodes are reused as the touch electrodes.

8. The display panel of claim 7, wherein each of the touch electrodes is a self-capacitive touch electrode, and the self-capacitive touch electrode comprises a first touch electrode; and
wherein at least one of the common electrodes is reused as the first touch electrode.

9. The display panel of claim 7, wherein each of the touch electrodes is a mutual-capacitive touch electrode, and the mutual-capacitive touch electrode comprises a second touch electrode and a third touch electrode;
wherein at least one of the common electrodes is reused as the second touch electrode or the third touch electrode.

10. The display panel of claim 7, wherein each of the touch electrodes is a mutual-capacitive touch electrode, and the mutual-capacitive touch electrode comprises a second touch electrode and a third touch electrode;
the pixel electrodes intersect with the common electrodes, and the liquid crystal display panel comprises N rows of first sub-pixels extending along an extension direction of the pixel electrodes or the common electrodes, wherein 1≤N≤100, and N is a positive integer;
at least one of the pixel electrodes is reused as the second touch electrode and at least one of the common electrodes is reused as the third touch electrode; and
in a display stage, the pixel electrodes and the common electrodes are used for driving a liquid crystal layer corresponding to first sub-pixels in a same row to deflect simultaneously.

11. The display panel of claim 6, wherein the organic light emitting diode display panel further comprises an encapsulation layer; and
wherein the liquid crystal display panel is reused as the encapsulation layer.

12. The display panel of claim 1, wherein the liquid crystal display panel further comprises a second array substrate, the second array substrate comprises a second pixel driving circuit; and
the second pixel driving circuit and the first pixel driving circuit are arranged at a same layer.

13. A display device, comprising:
a display panel and a sensor disposed in a sensor reservation region;
wherein the display panel comprises: a first display region and a second display region, wherein the first display region is reused as the sensor reservation region;
wherein the display panel further comprises an organic light-emitting diode display panel and a liquid crystal display panel, wherein the organic light-emitting diode display panel is disposed in the first display region and the second display region, the liquid crystal display panel is disposed in the first display region and on a light-emitting side of the organic light-emitting diode display panel, and the organic light-emitting diode display panel in the first display region is configured as a backlight for the liquid crystal display panel;
wherein the organic light-emitting diode display panel comprises a first array substrate and an organic light-emitting function film, wherein the first array substrate comprises a first pixel driving circuit, the first pixel driving circuit comprises a first A-type pixel driving circuit and a first B-type pixel driving circuit, the first A-type pixel driving circuit is used for driving the organic light-emitting function film in the first display region to emit light, the first B-type pixel driving circuit is used for driving the organic light-emitting function film in the second display region to emit light, and a density of the first A-type pixel driving circuit is less than a density of the first B-type pixel driving circuit; and
wherein the liquid crystal display panel comprises a plurality of first sub-pixels, and the plurality of first sub-pixels have a first sub-pixel density; and wherein the organic light-emitting function film in the second display region comprises a plurality of second sub-pixels, and the plurality of second sub-pixels have a second sub-pixel density, wherein the first sub-pixel density is the same as the second sub-pixel density.

14. The display device of claim 13, wherein the sensor comprises one or more of: a camera module, a photosensitive sensor and an ultrasonic distance sensor.

15. The display device of claim 14, wherein a liquid crystal display panel further comprises a color filter substrate, the color filter substrate comprises a first color resist layer, and the first color resist layer comprises a plurality of tiled color resist blocks of different colors;
wherein the camera module comprises a second color resist layer, and the second color resist layer comprises a plurality of tiled color resist blocks of different colors; and
wherein the second color resist layer is reused as the first color resist layer.

16. A compensation method for a display device, wherein the display device comprises a display panel and a camera module disposed in a sensor reservation region;
wherein the display panel comprises: a first display region and a second display region, wherein the first display region is reused as the sensor reservation region;
wherein the display panel further comprises an organic light-emitting diode display panel and a liquid crystal display panel, wherein the organic light-emitting diode display panel is disposed in the first display region and the second display region, the liquid crystal display panel is disposed in the first display region and on a light-emitting side of the organic light-emitting diode display panel, and the organic light-emitting diode display panel in the first display region is configured as a backlight for the liquid crystal display panel;
wherein the organic light-emitting diode display panel comprises a first array substrate and an organic light-emitting function film, wherein the first array substrate comprises a first pixel driving circuit, the first pixel driving circuit comprises a first A-type pixel driving circuit and a first B-type pixel driving circuit, the first A-type pixel driving circuit is used for driving the organic light-emitting function film in the first display region to emit light, the first B-type pixel driving circuit is used for driving the organic light-emitting function film in the second display region to emit light, and a density of the first A-type pixel driving circuit is less than a density of the first B-type pixel driving circuit;

wherein the liquid crystal display panel comprises a plurality of first sub-pixels and a color filter substrate, the plurality of first sub-pixels have a first sub-pixel density, and the color filter substrate comprises a first color resist layer; and wherein the organic light-emitting function film in the second display region comprises a plurality of second sub-pixels, and the plurality of second sub-pixels have a second sub-pixel density, wherein the first sub-pixel density is the same as the second sub-pixel density; and wherein the compensation method is used for compensating the display device at a camera shooting stage, and the method comprises:

acquiring a basic image shot by the display device, wherein the basic image comprises information about the first color resist layer;

determining, according to the information about the first color resist layer, a compensation algorithm for eliminating the information about the first color resist layer; and compensating a subsequently-shot image by using the compensation algorithm.

17. The compensation method of claim 16, wherein the first color resist layer comprises a plurality of tiled color resist blocks of different colors;

wherein the acquiring the basic image shot by the display device, wherein the basic image comprises the information about the first color resist layer, comprising:

acquiring a first basic image shot by the display device according to a preset image, wherein the preset image comprises known image information, and wherein the first basic image comprises the information about the first color resist layer; and wherein the determining, according to the information about the first color resist layer, the compensation algorithm for eliminating the information about the first color resist layer comprises:

determining, according to the preset image and the first basic image, a first compensation algorithm, wherein the first compensation algorithm is used for eliminating the information about the first color resist layer.

18. The compensation method of claim 16, wherein the first color resist layer comprises a plurality of tiled red color resist blocks, a plurality of tiled green color resist blocks and a plurality of tiled blue color resist blocks;

wherein the acquiring the basic image shot by the display device, wherein the basic image comprises the information about the first color resist layer, comprising:

acquiring a plurality of basic images shot by the display device, wherein the plurality of basic images comprise at least a second basic image comprising information about the plurality of red color resist blocks, a third basic image comprising information about the plurality of green color resist blocks and a fourth basic image comprising information about the plurality of blue color resist blocks; and wherein the determining, according to the information about the first color resist layer, the compensation algorithm for eliminating the information about the first color resist layer comprises:

configuring a superposition operation of the second basic image, the third basic image and the fourth basic image as a second compensation algorithm, wherein the second compensation algorithm is used for eliminating the information about the plurality of red color resist blocks, the information about the plurality of green color resist blocks and the information about the plurality of blue color resist blocks.

\* \* \* \* \*